US012700839B2

(12) United States Patent

Gustafsson et al.

(10) Patent No.: US 12,700,839 B2

(45) Date of Patent: Aug. 4, 2026

(54) AMPLIFIER ARRANGEMENT WITH ENHANCED HARMONIC REJECTION

(71) Applicant: Telefonaktiebolaget LM Ericsson (publ), Stockholm (SE)

(72) Inventors: David Gustafsson, Sävedalen (SE); Björn Albinsson, Gothenburg (SE); Per Ingelhag, Alingsås (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 488 days.

(21) Appl. No.: 18/039,880

(22) PCT Filed: Dec. 7, 2020

(86) PCT No.: PCT/EP2020/084911

§ 371 (c)(1),
(2) Date: Jun. 1, 2023

(87) PCT Pub. No.: WO2022/122115

PCT Pub. Date: Jun. 16, 2022

(65) Prior Publication Data

US 2024/0039491 A1 Feb. 1, 2024

(51) Int. Cl.
H03F 3/26 (2006.01)
H03F 1/02 (2006.01)
(Continued)

(52) U.S. Cl.
CPC ............. H03F 3/26 (2013.01); H03F 1/0288 (2013.01); H03F 1/307 (2013.01); H03F 3/211 (2013.01); H03F 2200/372 (2013.01)

(58) Field of Classification Search
CPC ...... H03F 3/26; H03F 2200/372; H03F 1/565; H03F 2200/06; H03F 2200/09;
(Continued)

(56) References Cited

U.S. PATENT DOCUMENTS

| 6,697,611 B1* | 2/2004 | Franca-Neto | ............ H04B 1/30 455/306 |
| 2011/0063028 A1* | 3/2011 | Kawakami | .............. H03F 3/602 330/252 |

(Continued)

FOREIGN PATENT DOCUMENTS

| EP | 2 365 413 A1 | 9/2011 |
| WO | 2016/054619 A1 | 4/2016 |
| WO | 2020/182305 A1 | 9/2020 |

OTHER PUBLICATIONS

International Search Report and Written Opinion issued in International Application No. PCT/EP2020/084911 dated Sep. 2, 2021 (17 pages).

(Continued)

*Primary Examiner* — Khanh V Nguyen
(74) *Attorney, Agent, or Firm* — Weisberg I.P. Law, P.A.

(57) ABSTRACT

The present disclosure relates to an amplifier arrangement (1, 100, 200) comprising a first amplifier device (2, 102, 202) and a second amplifier device (3, 103, 203) where each amplifier device (2, 3; 102, 103; 202, 203) is connected to an input circuit (8, 108) and has a first type output terminal (4, 6; D) and a second type output terminal (5, 7; S), where the output terminals (4, 6, D; 5, 7, S) are connected to an output circuit (9, 109, 109'). The first type output terminal (4, D) of the first amplifier device (2, 102, 202) is connected to the second type output terminal (7, S) of the second amplifier device (3, 103, 203) by means of a first connection (10, 110), and the first type output terminal (6, D) of the second amplifier device (3, 103, 203) is connected to the second type output terminal (5, S) of the first amplifier device (2, 102, 202) by means of a second connection (11, 111). The first type output terminal (4, D) of the first amplifier device (2, 102, 202) and the first type output terminal (6, D) of the second amplifier device (3, 103, 203) are electrically sepa- (Continued)

rated in the output circuit (9, 109, 109'), and the second type output terminal (5, S) of the first amplifier device (2, 102, 202) second type output terminal (7, S) of the second amplifier device (3, 103, 203) are electrically separated in the output circuit (9, 109, 109').

18 Claims, 7 Drawing Sheets

(51) Int. Cl.
*H03F 1/30* (2006.01)
*H03F 3/21* (2006.01)

(58) Field of Classification Search
CPC ..... H03F 2200/189; H03F 2203/45216; H03F 3/265; H03F 3/45475; H03F 3/3088; H03F 1/22; H03F 3/45089; H03F 3/45183; H03F 3/45179; H03F 3/45192; H03F 3/3022; H03F 3/3076; H03F 3/3066; H03F 3/3071; H03F 3/3001; H03F 3/345

USPC ................................................. 330/262–264
See application file for complete search history.

(56) References Cited

U.S. PATENT DOCUMENTS

2013/0027272 A1* 1/2013 Karthaus ................. H03F 3/602
                                                                    700/121
2018/0076771 A1* 3/2018 Gomez ................... H03F 1/305

OTHER PUBLICATIONS

Nesbitt, P. et al., "4 GHz 3D-Printed Balun-Fed Bowtie Antenna With Finite Ground Plane for Gain and Impedance Matching Enhancement", Apr. 11, 2016 IEEE 17th Annual Wireless and Microwave Technology Conference (3 pages).
Cripps, S., "The Evolution of the Push-Pull RFPA", IEEE, 2015 (4 pages).
EPO Communication dated May 27, 2025 for Patent Application No. 20820900.7, consisting of 6 pages.

* cited by examiner

S100
Providing amplifier devices

S200
Connecting amplifier devices to input circuit

S300
Connecting amplifier devices to output circuit

S400
Connecting amplifier terminals using first connection

S500
Connecting amplifier terminals using second connection

AMPLIFIER ARRANGEMENT WITH ENHANCED HARMONIC REJECTION

CROSS REFERENCE TO RELATED APPLICATIONS

This application is a 35 U.S.C. § 371 National Stage of International Patent Application No. PCT/EP2020/084911, filed 2020 Dec. 7.

TECHNICAL FIELD

The present disclosure relates to amplifiers, in particular push-pull circuit to amplifiers, where there is a desire to reject undesired harmonics.

BACKGROUND

The number of frequency bands and hardware frequency variants has grown rapidly which has created a strong demand for wideband radios and power amplifiers (PAs). A well-known problem with such wideband PAs is that harmonic frequencies and intermodulation products, e.g. $2^{nd}$ order tones such as baseband and $2^{nd}$ order harmonics, falls within the carrier frequency band and can result in imminent performance degradation. For example, baseband frequencies that fall within the fundamental band will face resistive terminations, resulting in distortion and lower efficiency. The same is true for $2^{nd}$ harmonic tones within the fundamental band. In addition, intermodulation products and harmonic tones within the fundamental band might require band-specific filters in order to comply with emission standards. Such a requirement severely reduces the benefit of the wideband radio by complicating the design and deployment, and by requiring an inventory of band-specific filters.

An uncomplicated solution to the described problem is operating the PA in class-A mode. When doing so, very low content of intermodulation products, such as baseband, and harmonic content is generated. The drawback is poor energy efficiency which in practice disqualifies such solution in most applications.

A more attractive method is the Push-Pull class-B amplifier. It is well known that such an amplifier configuration can differentiate between common and differential mode, and it thereby has a theoretical capability to present ideal load terminations for both second order tones and fundamental frequency even though they appear within the same band. In other words; it allows e.g. the baseband tones, and the second harmonic tones to be short-circuited even though they fall within the band where the fundamental tone is terminated in its ideal load.

In prior art FIG. 1, the output currents Icm, Idm in a push-pull amplifier arrangement are indicated with dashed lines. Assuming the network is symmetrical, i.e. Z11=Z22, the load impedance seen by amplifier devices, here represented as current sources I1, I2, becomes ZL,d=Z11−Z12 at differential mode, and ZL,c=Z11+Z12 at common mode.

In the case of using complementary device techniques (n-type and p-type), the fundamental frequency is excited in common mode, and even order tones such as baseband and 2nd harmonics are excited in differential mode The desired short-circuit impedance for even order tones is then easily realized by letting Z11=Z22=Z12, see FIG. 1. However, the limited performance of p-type transistors makes them a no option in high performance RF/microwave applications. Using only n-type devices, the situation becomes the opposite to what is described above, i.e. the fundamental frequency is excited in differential mode and even order tones are excited in common mode. Hence the output network in FIG. 1 must fulfill Z11=Z22=−Z12 which is very challenging over a large bandwidth.

It is therefore desired to present a new type of circuit topology that enables wideband capabilities of amplifiers that can be run as push-pull amplifiers.

SUMMARY

It is an object of the present disclosure to provide a circuit topology that enables wideband capabilities of amplifiers that can be run as push-pull amplifiers.

This object is obtained by means of amplifier arrangement comprising a first amplifier device and a second amplifier device, where each amplifier device is connected to an input circuit. Each amplifier device has a first type output terminal and a second type output terminal where the output terminals are connected to an output circuit. The first type output terminal of the first amplifier device is connected to the second type output terminal of the second amplifier device by means of a first connection, and the first type output terminal of the second amplifier device is connected to the second type output terminal of the first amplifier device by means of a second connection. The first type output terminal of the first amplifier device and the first type output terminal of the second amplifier device are electrically separated in the output circuit, and the second type output terminal of the first amplifier device second type output terminal of the second amplifier device are electrically separated in the output circuit.

By connecting equivalent nodes in the two branches of a amplifiers with separated ground planes, having different potentials enables to amplifier devices to be run as push-pull amplifiers with a low impedance at common mode over a very large bandwidth without effecting the impedance at differential mode. Operation with higher efficiency and less distortion over a larger bandwidth is enabled.

If the amplifier devices are run in a differential mode, the amplifier devices will output both a differential mode and a common mode, where the common mode may be terminated in an impedance that can be a low reactive impedance. The differential mode can be terminated, for example in a load resistance.

According to some aspects, each connection comprises a direct current, DC, blocking component.

This way, an efficient DC bias of the amplifier devices is enabled.

According to some aspects, each connection constitutes a short-circuit at a pre-determined signal frequency band.

In this way, the connections are transferring signals for a desired frequency band while still enabling an efficient DC bias of the amplifier devices.

According to some aspects, the amplifier devices are adapted to be run in a differential mode and in a common mode, where, for a certain frequency band, a majority of the current supplied by the amplifier devices runs via the connections when the amplifier devices are a run in the common mode.

According to some aspects, the input circuit comprises an input balun and one input matching network for each input signal.

This means that a balanced signal is generated by the input balun that is integrated into the input circuit.

According to some aspects, the input balun is constituted by a broadside coupled line input where a ground plane is provided between the broadside coupled lines of the line input to create two microstrip lines.

In this way, the input balun can be formed by means of microstrip conductors.

According to some aspects, the input circuit comprises transmission lines running from the input balun towards input matching networks. The amplifier arrangement comprises a resistive component that connects ground potentials of each transmission line.

In this way, undesired modes propagating between the ground planes can be suppressed.

According to some aspects, the input circuit comprises two digital-to-analogue converters (DACs) that are connected to the respective terminals of the amplifier devices.

According to some aspects, the DACs are adapted to receive signal input by means of corresponding optical couplers.

According to some aspects, the input circuit comprises two optical couplers that are connected to the respective terminals of the amplifier devices.

This way, the input circuit can be realized in alternative ways.

According to some aspects, the output circuit comprises at least one output matching network.

According to some aspects, the connections are connected to at least partly constitute an output balun that is connected to the output matching network.

This way, the connections are utilized to create a wideband balun with low impedance at common mode, or as a mean to achieve common mode short circuit at nodes separated from the output balun, e.g. in a distributed amplifier. The matching of the amplifier devices can be made after the output balun.

According to some aspects, the second type output terminals of the amplifier devices are connected to electrically separated ground planes.

According to some aspects, the separated ground planes are formed by means of a slot in a ground plane, the slot having a first longitudinal side and a second longitudinal side. The first type output terminal of the first amplifier device and the second type output terminal of the second amplifier device are connected to the ground plane along the first longitudinal side of the slot, and the second type output terminal of the first amplifier device and the first type output terminal of the second amplifier device are connected to the ground plane on an opposite side of the slot, along the second longitudinal side of the slot.

According to some aspects, the output circuit comprises transmission lines running from the output matching network to an output balun, where the amplifier arrangement comprises a resistive component that connects ground potentials of each transmission line.

In this way, undesired modes propagating between the ground planes can be suppressed. Furthermore, the amplifier devices can be separated from the output balun which is suitable in implementations where matching and/or impedance transformation is preferred between the amplifier devices and the output balun, e.g. in a distributed amplifier.

This object is also obtained by means of methods that are associated with the above advantages.

BRIEF DESCRIPTION OF THE DRAWINGS

The present disclosure will now be described more in detail with reference to the appended drawings, where.

DETAILED DESCRIPTION

Figure 1:
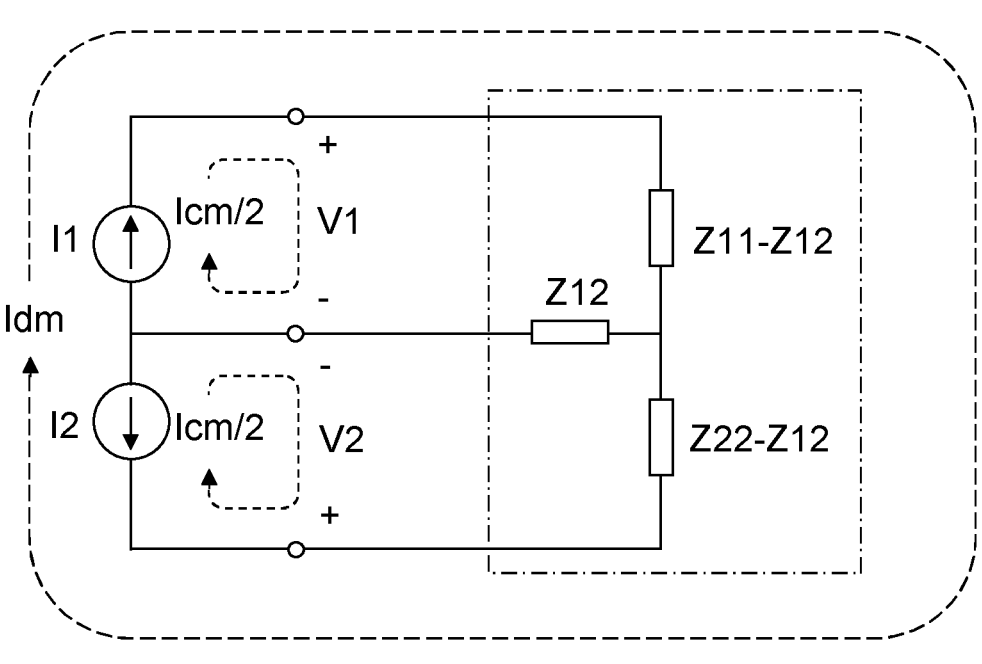
FIG. 1 shows schematics of a prior art push-pull amplifier arrangement.

Aspects of the present disclosure will now be described more fully hereinafter with reference to the accompanying drawings. The different devices, systems, computer programs and methods disclosed herein can, however, be realized in many different forms and should not be construed as being limited to the aspects set forth herein. Like numbers in the drawings refer to like elements throughout.

The terminology used herein is for describing aspects of the disclosure only and is not intended to limit the invention. As used herein, the singular forms "a", "an" and "the" are intended to include the plural forms as well, unless the context clearly indicates otherwise.

Figure 2A:
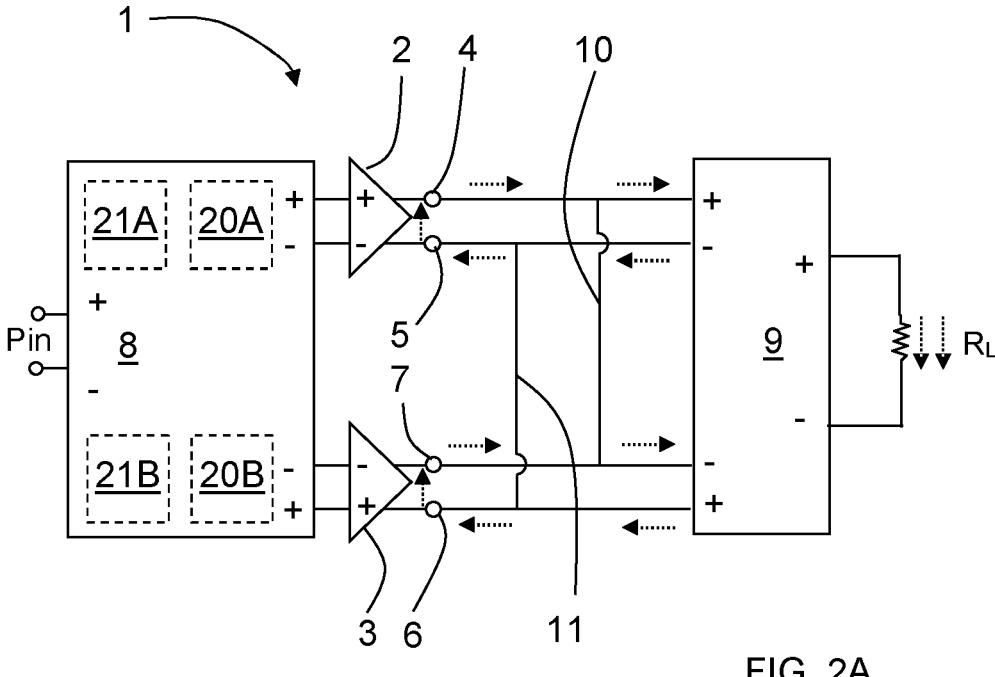
FIG. 2A shows schematics of a general push-pull amplifier arrangement according to the present disclosure in a differential mode.

With reference to FIG. 2A, there is a schematic of a general setup for an n-type or p-type push-pull amplifier arrangement 1 comprising a first amplifier device 2 and a second amplifier device 3. This general setup will be used for initially describing the present disclosure. The amplifier devices 2, 3 are of class B, class AB or any other suitable type which can be biased in such a way so that each amplifier device only conducts during approximately one half cycle of an input signal waveform.

Simplified, for such biasing, in a differential mode, at the carrier frequency the signals from the amplifier devices are intended to be added in phase with each other such that a useful signal is output. In a common mode, even harmonics or mixing products, which are the only harmonics present, are intended to be added 180° out of phase such that there is no output signal for these signals. It is to be noted that the differential mode and the common mode normally occur simultaneously.

Each amplifier device 2, 3 is connected to an input circuit 8, and has a first type output terminal 4, 6, marked as positive (+) and a second type output terminal 5, 7, marked as negative (−), where the output terminals 4, 6; 5, 7 are connected to an output circuit 9. According to the present disclosure, the first type output terminal 4 of the first amplifier device 2 is connected to the second type output terminal 7 of the second amplifier device 3 by means of a first connection 10, and the first type output terminal 6 of the second amplifier device 3 is connected to the second type output terminal 5 of the first amplifier device 2 by means of a second connection 11. Furthermore, the output network 9 should electrically separate the second type output terminal 5 of the first amplifier device 2 from the second type output terminal 7 of the second amplifier device 3. Correspondingly, the output network 9 should electrically separate the first type output terminal 4 of the first amplifier device 2 from the first type output terminal 6 of the second amplifier device 3. In this context, the term electrically separate refers to a practical electrical separation that for example can be accomplished by means of galvanic separation or by means of transmission lines that are connected to each other at a certain length from the output terminals 4, 5; 6, 7.

Although an analogue balun will be disclosed as being comprised in the input circuit 8 in the following examples, generally, the input circuit 8 is adapted to create input signal which are 180° out of phase with each other, and can be based on analogue, digital and/or optical circuit elements. This means that the input circuit 8 can be adapted to create an input signal in a digital manner as will be discussed briefly below.

Figure 2B:
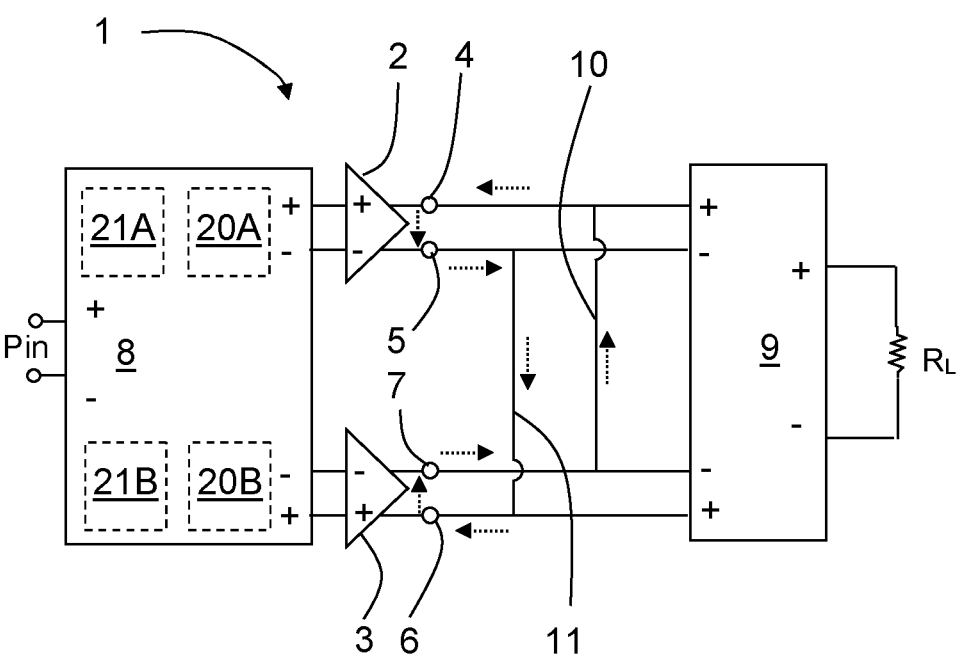
FIG. 2B shows schematics of a general push-pull amplifier arrangement according to the present disclosure in a common mode.

In this manner, separated ground planes are provided for the amplifier devices 2, 3, providing a common mode short-circuit since all current runs in the connections 10, 11 as shown in FIG. 2B. This creates a low impedance at the common mode over a relatively large bandwidth without effecting the impedance at differential mode, as illustrated in FIG. 2A. The amplifier arrangement 1 can operate with higher efficiency and less distortion over a larger bandwidth. The connections 10, 11 can be utilized to create a wideband output balun in the output circuit 9 with low impedance at common mode, or as a mean to achieve common mode short-circuit at nodes separated from the balun, e.g. in a distributed amplifier.

Note that the described connections in the ideal case are assumed to have zero length and zero parasitics. In a real implementation, that is of course not possible, but the connections should be made as short as possible. Also note that FIG. 2A and FIG. 2B illustrates the principle of the connections 10, 11 at AC frequencies. For desired properties at DC there might be a need of DC-blocks which are not included, but will be included in further more detailed examples. In all examples, there is of course suitable DC feed circuitry. For reasons of clarity, this is not shown in the Figures, being of obvious character and in itself not being a part of the present disclosure.

Figure 3A:
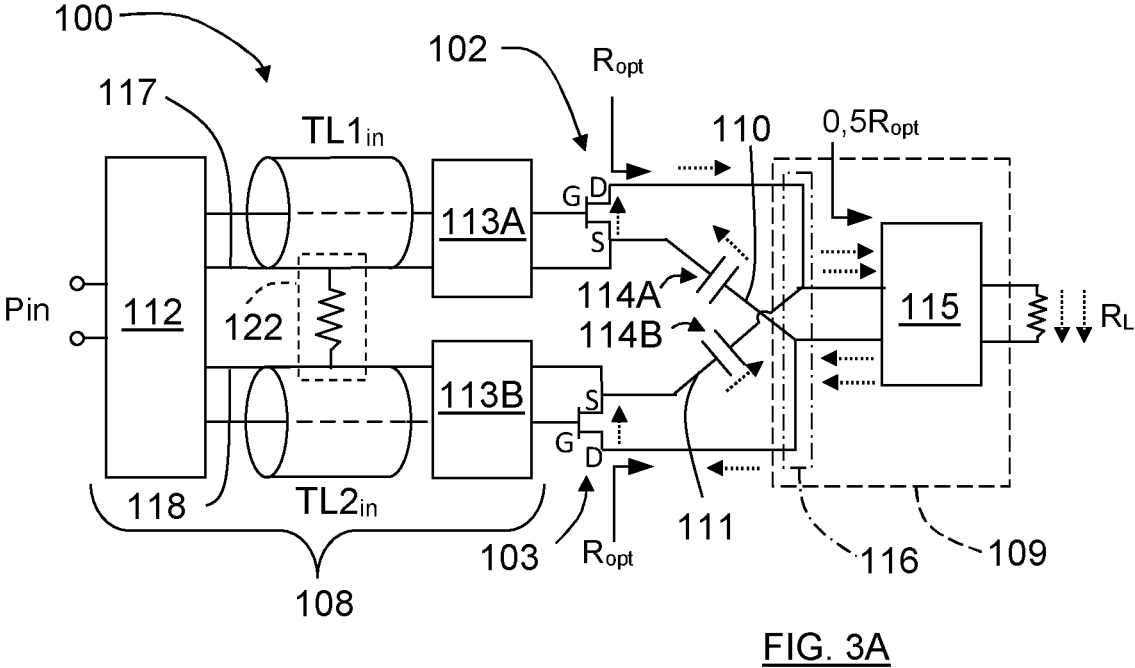
FIG. 3A shows schematics of a push-pull amplifier arrangement according to a first example in a differential mode.
Figure 3B:
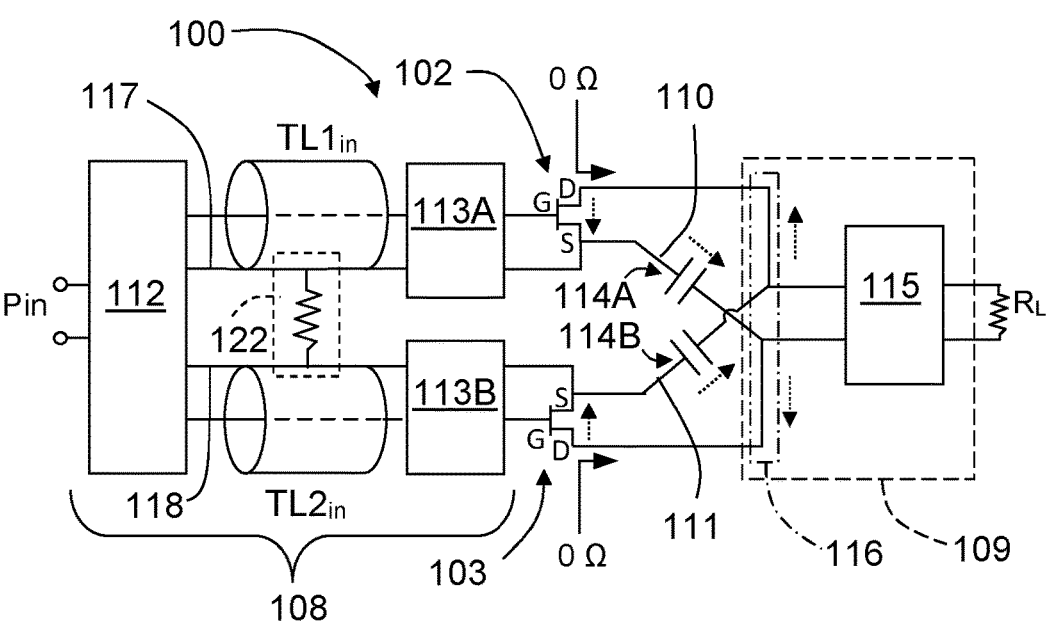
FIG. 3B shows schematics of a push-pull amplifier arrangement according to a first example in a common mode.

In FIG. 3A and FIG. 3B, illustrating a first detailed example, the connections 110, 111 are connected such that an output balun 116 is formed, having a wideband low impedance at a common mode that is shown in FIG. 3B. According to some aspects, there is an output matching network 115 placed after the output balun 116, where the output matching network 115 further is connected to a load $R_L$. In this case, an output circuit 109 comprises the output balun 116 and the output matching network 115. According to some aspects, an input circuit 108 comprises an input balun 112 and one input matching network 113A, 113B for each input signal. Each input signal is transmitted from the input balun 112 to the corresponding input matching network 113A, 113B by means of input transmission lines $TL1_{in}$, $TL2_{in}$. The amplifier devices 102, 103 are of the same type, each comprising a source terminal S, a gate terminal G and a drain terminal D. The output balun 116 is formed by connecting the drain terminals D and the connections 110, 111 in the output circuit 109 such that an unbalanced connection is formed, the connections 110, 111 at least partly being comprised in the output balun 116. The source terminals S of the amplifiers devices 102, 103 are electrically separated in the output circuit 109 by means of the output balun 116. The drain terminals D of the amplifiers devices 102, 103 are also electrically separated in the output circuit 109 by means by means of the output balun 116. The unbalanced connection passes the output matching network and is connected outside the output circuit 109 via the load resistance $R_L$.

As an alternative, as indicated above, the input circuit 108 could instead be constituted by two digital-to-analogue converters (DACs) that are directly connected to the respective source terminal S and gate terminal G of the amplifier devices 102, 103. This is illustrated in FIG. 2A and FIG. 2B, where the input circuit 8 according to some aspects comprises a first DAC 20A that is connected to the first amplifier device 2, optionally being fed via a first optical coupler 21A. Correspondingly, the input circuit 8 then also comprises a second DAC 20B that is connected to the second amplifier device, optionally being fed via a second optical coupler 21B. In this case, there is no separate input balun. The optical couplers 21A, 21B are used when the digital input signal is an optical signal.

According to some further aspects, there are no DAC:s but the input circuit 8 comprises a first optical coupler 21A and a second optical coupler 21B, where the optical couplers 21A, 21B are connected to the respective terminals of the amplifier devices 2, 3. In this case, the amplifier devices 2, 3 are fed analog signals directly via the optical couplers 21A, 21B.

The source terminals S are connected to input 117, 118 ground planes that are sufficiently isolated from each other since the load $R_L$ otherwise becomes short-circuited.

FIG. 3A illustrates the push-pull functionality at a differential mode, i.e. when the amplifier devices 102, 103 feed the output with signals equal in amplitude but shifted 180° in phase. With this setup, the currents, which are illustrated with dotted arrows on an output side only, add in parallel, and the intrinsic impedances presented to the amplifier devices 102, 103 by the output matching network 115 should equal $0.5R_{opt}$, where $R_{opt}$ is the optimum load presented to the respective intrinsic current source in the amplifier devices 102, 103, for a desired performance.

Between the intrinsic current source and the physical amplifier device output there are in practice normally some parasitics that results in that the optimal load as seen from the amplifier device output differs from $R_{opt}$, and can be referred to as intrinsic load.

FIG. 3B illustrates the push-pull functionality in a common mode. The currents then become short-circuited and no current passes through the load $R_L$. The impedances presented to the amplifier devices 102, 103 should equal about 0Ω, i.e. short-circuit.

Figure 4A:
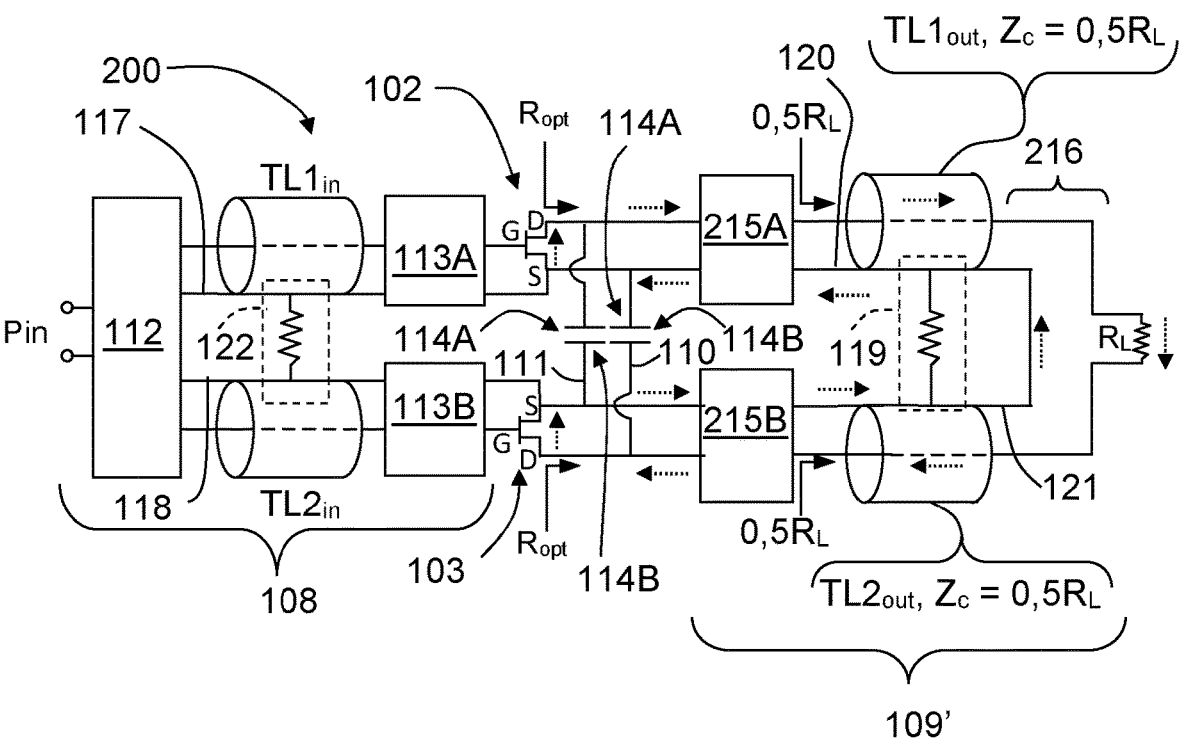
FIG. 4A shows schematics of a push-pull amplifier arrangement according to a second example in a differential mode.
Figures 4B, 5:
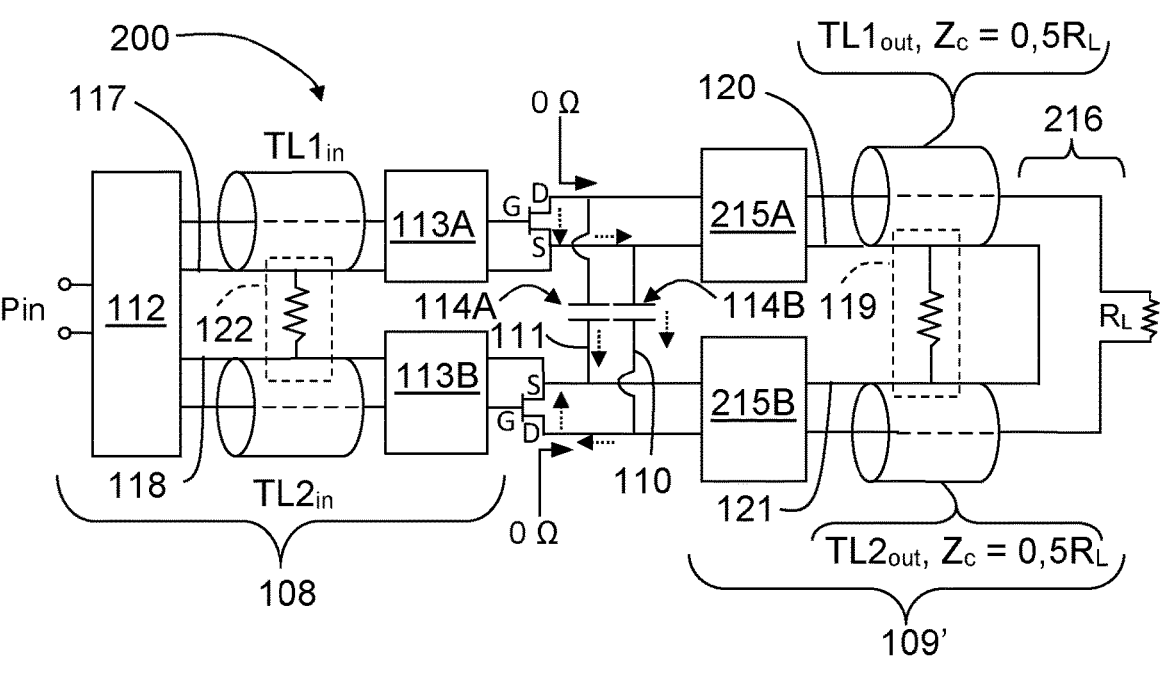
FIG. 4B shows schematics of a push-pull amplifier arrangement according to a second example in a common mode.
FIG. 5 shows details of an input balun of a push-pull amplifier arrangement according to the first example.

FIG. 4A and FIG. 4B, illustrating a second detailed example, show a configuration where there are two output matching networks 215A, 215B which are connected between the amplifier devices 102, 103 and an output balun 216 via output transmission lines $TL1_{out}$, $TL2_{out}$ comprising output ground planes 120, 121. According to some aspects, in the same way as for the first detailed example, an input circuit 108 comprises an input balun 112 and one input matching network 113A, 113B for each input signal. Each input signal is transmitted from the input balun 112 to the corresponding input matching network 113A, 113B by means of input transmission lines $TL1_{in}$, $TL2_{in}$. The amplifier devices 102, 103 are of the same type, each comprising a source terminal S, a gate terminal G and a drain terminal D. An output circuit 109' comprises the output matching networks 215A, 215B, the output transmission lines $TL1_{out}$, $TL2_{out}$ and the output balun 216.

The source terminals S are connected to input ground planes 117, 118 that are sufficiently isolated from each other since the load $R_L$ otherwise becomes short-circuited.

FIG. 4A illustrates the push-pull functionality at a differential mode, i.e. when the amplifier devices 102, 103 feed the output with signals equal in amplitude but shifted 180° in phase. With this setup, the currents, which are illustrated with dotted arrows on an output side only, add in phase, and the impedances presented to the amplifier devices 102, 103 after the output matching networks 215A, 215B should equal $0.5R_L$, where $R_L$ is the load resistance.

FIG. 4B illustrates the push-pull functionality in a common mode. The currents then become short-circuited and no current passes through the load $R_L$. The impedances presented to the amplifier devices 102, 103 should equal 0Ω, i.e. short-circuit.

For both examples discussed above with reference to FIG. 3A, FIG. 3B, FIG. 4A and FIG. 4B, according to some aspects, each connection 110, 111 comprises a direct current, DC, blocking component 114A, 114B that prevent DC bias currents fed to the amplifier devices 102, 103 to run towards the output matching network 115.

According to some aspects, there is one or multiple resistors 122 connected between the input ground planes 117, 118 of the input transmission lines $TL1_{in}$, $TL2_{in}$, and for the example with reference to FIG. 4A and FIG. 4B there is also a resistor 119 connected between the output ground planes 120, 121 of the output transmission lines $TL1_{out}$, $TL2_{out}$. These resistors 122, 119 are used to suppress potential modes propagating between these ground planes. To suppress unwanted propagation, possible coupling between the ground planes 117, 118; 120, 121 should be minimized, and this can also be obtained by choosing a proper electrical length the transmission lines $TL1_{in}$, $TL2_{in}$, $TL1_{out}$, $TL2_{out}$. The output ground planes 120, 121 are electrically connected in the output balun 216, but there can be a significant electrical distance between the resistor 119 connected between the output ground planes 120, 121 of the output transmission lines $TL1_{out}$, $TL2_{out}$ and the output balun 216. The output transmission lines $TL1_{out}$, $TL2_{out}$ have such an electrical length that the source terminals S of the amplifiers devices 102, 103 are electrically separated in the output circuit 109'. The drain terminals D of the amplifiers devices 102, 103 are electrically separated in the output circuit 109' by means of galvanic separation and are connected outside the output circuit 109' via the load resistance $R_L$.

Although the transmission lines $TL1_{in}$, $TL2_{in}$, $TL1_{out}$, $TL2_{out}$ are illustrated as coaxial lines, other types of transmission lines may be used such as for example microstrip lines or strip lines.

According to some aspects, the input balun 112 can comprise a digital arrangement that can be adapted to generate an input signal digitally. In the FIGS. 2A, 2B, 3A, 3B, 4A, 4B and 5 an input port Pin is indicated. If an input signal is generated in the input circuit 8 or in the input balun 112, there is no need for a separate input port Pin.

FIG. 5 corresponds to the configuration of FIG. 3A and FIG. 3B. In this example, according to some aspects, the input balun 112 consist of a broad side coupled line input 320 where a ground plane 317 is provided between the broad side coupled lines of the line input 320 to create two microstrip lines 321, 322 on each side of a slot. According to some further aspects, the microstrip lines 321, 322 each have a characteristic impedance that according to some aspects can be 50Ω. Furthermore, at a differential mode, the impedances presented to the amplifier devices 102, 103 by the output matching network 115 should equal 100Ω. Other values of the characteristic impedance are of course conceivable.

Figure 6A:
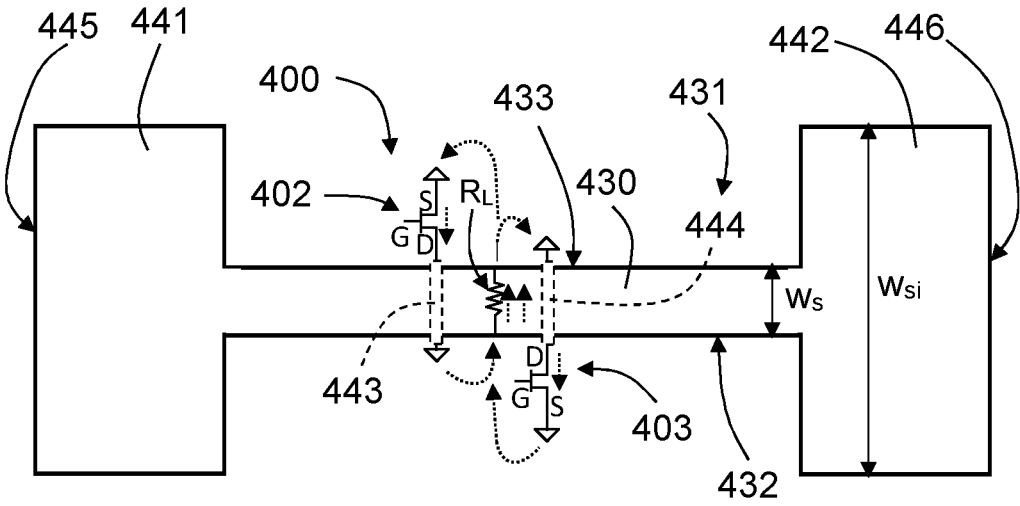
FIG. 6A shows a simplified first example of a realization of a push-pull amplifier arrangement in a differential mode, where the output balun is formed in a slot.
Figure 6B:
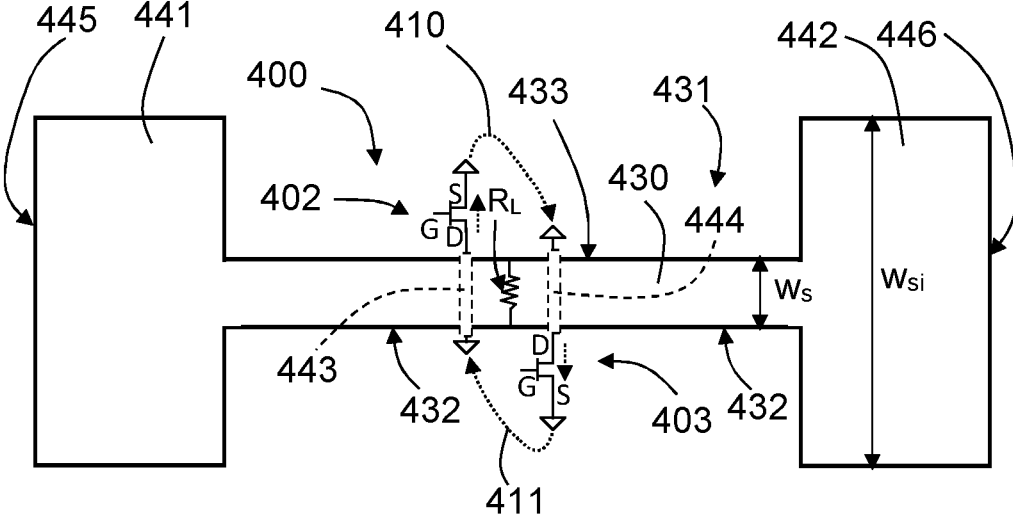
FIG. 6B shows the simplified first example of FIG. 6A in a common mode.

According to some further aspects, from FIG. 3A and FIG. 3B it follows that the source terminals S of the amplifier devices 102, 103 should be connected to separated ground planes. In a PCB-design, such separation can be achieved by making a sufficiently large slot 430 in a ground plane as schematically illustrated in FIG. 6A, illustrating a differential mode, in FIG. 6B, illustrating a common mode. Note that the schematics of FIG. 6A and FIG. 6B is simplified to illustrate the principle of the implementation and e.g. DC-blocks are omitted. The drain D and the source S terminals of each amplifier devices 402, 403 are connected to opposite sides of the slot 430 and that the output load $R_L$ is placed across the slot 430. As illustrated in FIG. 6A, all currents passes thru the load $R_L$ at differential mode, whereas, as illustrated in FIG. 6B, no currents passes thru the load $R_L$ in common mode. The currents are indicated with dotted arrows.

More in detail, the slot 430 having a slot width $w_s$ is formed in a ground plane 431, the slot having a first longitudinal side 432 and a second longitudinal side 433, where the first type output terminal D of the first amplifier device 402 and the second type output terminal S of the second amplifier device 403 are connected to the ground plane 431 along the first longitudinal side 432 of the slot 430. The slot has a first end part 441 with increased slot width $w_{si}$ and a second end part 442 with the increased slot width $w_{si}$. By means of this increased slot width $w_{si}$, the coupling between opposite sides of the slot 430 is reduced. This shape of the slot 430 makes it possible to fairly accurate regard it as an inductive connection, increasing the inductance and lowering the resonance frequency. According to some aspects, the electrical length from the center of the slot 430 to each short-circuited edge 445, 446 is kept close to 90° at the center frequency. According to other aspects, i.e. when having a non neglible device drain-to-source capacitance, the electrical length from the center of the slot 430 to each short-circuited edge 445, 446 is kept below 90° at the center frequency The first type output terminals D of the amplifier devices 402, 403 are connected to the ground plane 431 on an opposite side of the slot 430, along the second longitudinal side 433 of the slot 430. More in detail, the first type output terminal D of the first amplifier device 402 is connected to ground at the other side of the slot 430 by means of a first conductor 443 that passes the slot 430 at the opposite side. Correspondingly, the first type output terminal D of the second amplifier device 402 is connected to ground at the other side of the slot 430 by means of a second conductor 444 that passes the slot 430 at the opposite side. The conductors 443, 444 have an electrical length that falls below an electrical length of 90° at the center frequency with a large margin, and practically these conductors 443, 444 barely cross the slot 430, i.e. they cross the slot 430 but do not continue any farther than, at least not more than necessary. According to some aspects, the conductors 443, 444 have an electrical length that at least equals the slot width $w_s$ and should fall below an electrical length of 20°, preferably fall below an electrical length of 10°, and even more preferably fall below an electrical length of 5° at a center frequency of a desired frequency band. In case the conductors 443, 444 are grounded by means of via connections, the via length is included in the length of the conductors 443, 444 that according to some aspects are constituted by microstrip or stripline conductors. A desired frequency band is a frequency band for which the amplifier arrangement is intended to be operational.

The slot 430 will act as a short-circuited slot line that should be made as wide as possible in order to avoid unwanted mode propagation and with a proper length for the targeted bandwidth.

Figure 7:
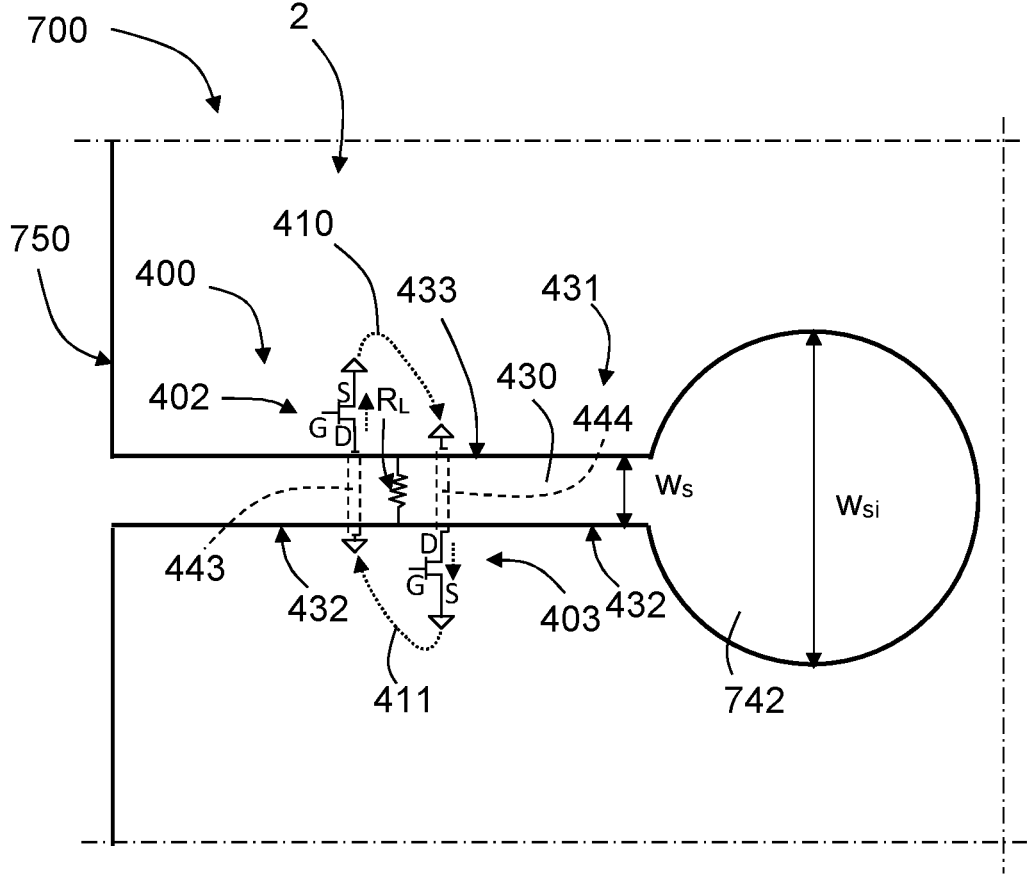
FIG. 7 shows a simplified second example of a realization of a push-pull amplifier arrangement in a common mode.

FIG. 7 shows an alternative of how the slot in FIG. 6B can be configured for an amplifier arrangement 700. The common mode is shown in FIG. 7, but the arrangement of FIG. 7 is of course applicable for the differential mode as well. Here, the left side of the slot 730 is terminated in an open circuit at an edge 750 of the circuit board, resulting in a potentially larger differential mode bandwidth compared to the configuration in FIGS. 6A and 6B. The slot here only has one end part 742 with a maximum increased slot width $w_{si}$, and in this example the end part 742 has a circular shape. Of course, any shape of the end parts is conceivable for all types of slots, for examples stepped structures where the width increases and/or decreases in steps to a maximum value, or a tapered part where the width increases continuously to a maximum value, where the maximum value can be anywhere in the end part. The slot can have any type of shape, where different end parts can have different shapes.

Other types of slots are of conceivable, according to some aspects, the slot can be arranged in one or more metallization layers, the slot being longitudinally divided over the slot gap. The microstrip/stripline conductors can be arranged in one, two or three other metallization layer. The microstrip/stripline conductors can thus be made in the same metal layer. In the case of the slot being formed in two or more metallization layers, the conductors can run between these metallization layers.

According to some aspects, the ground symbols in FIG. 6A, FIG. 6B and FIG. 7 denote a local ground or local reference plane, where the slot separates the grounds.

With reference to the general setup outlined in FIG. 2A and FIG. 2B, it is a main concept of the present disclosure that two amplifier devices 2, 3 of the same type are run in a push-pull configuration, where a first type output terminal 4 of a first amplifier device 2 is connected to a second type output terminal 7 of a second amplifier device 3, and where the second type output terminal 5 of the first amplifier device 2 is connected to the first type output terminal 6 of the second amplifier device 3. This provides separated ground planes at the output of the amplifier devices, and enables The amplifier devices 2, 3 can be of class B, class AB or any other suitable type which can be biased in such a way so that each amplifier device only conducts during approximately one half cycle of an input signal waveform. The amplifier devices 2, 3 can for example be of n-type or p-type. In the general case, no input baluns are required.

In practice, the term short-circuit relates to a low impedance connection which according to some aspects is present for one or more frequency bands.

It is to be noted that the connections 10, 11; 110, 111; 410, 411 only are schematically indicated and are adapted to electrically connect a first type output terminal 4, D of the first amplifier device 2, 102, 202 to a second type output terminal 7, S of the second amplifier device 3, 103, 203, and to connect the first type output terminal 6, D of the second amplifier device 3, 103, 203 to the second type output terminal 5, S of the first amplifier device 2, 102, 202.

The term electrically separated refers to an electrical separation that can be accomplished in several ways as discussed above.

The present disclosure relates to an amplifier arrangement 1, 100, 200 comprising a first amplifier device 2, 102, 202 and a second amplifier device 3, 103, 203, each amplifier device 2, 3; 102, 103; 202, 203 being connected to an input circuit 8, 108. Each amplifier device 2, 3; 102, 103; 202, 203 has a first type output terminal 4, 6; D and a second type output terminal 5, 7; S where the output terminals 4, 6, D; 5, 7, S are connected to an output circuit 9, 109, 109'. The first type output terminal 4, D of the first amplifier device 2, 102, 202 is connected to the second type output terminal 7, S of the second amplifier device 3, 103, 203 by means of a first connection 10, 110, and the first type output terminal 6, D of the second amplifier device 3, 103, 203 is connected to the second type output terminal 5, S of the first amplifier device 2, 102, 202 by means of a second connection 11, 111. The first type output terminal 4, D of the first amplifier device 2, 102, 202 and the first type output terminal 6, D of the second amplifier device 3, 103, 203 are electrically separated in the output circuit 9, 109, 109', and the second type output terminal 5, S of the first amplifier device 2, 102, 202 second type output terminal 7, S of the second amplifier device 3, 103, 203 are electrically separated in the output circuit 9, 109, 109'.

According to some aspects, each connection 110, 111 comprises a direct current, DC, blocking component 114A, 114B.

According to some aspects, each connection 10, 11; 110, 111 constitutes a short-circuit at a pre-determined signal frequency band.

According to some aspects, the amplifier devices 2, 3, 102, 103; 202, 203 are adapted to be run in a differential mode and in a common mode, where, for a certain frequency band, a majority of the current supplied by the amplifier devices 2, 3; 102, 103; 202, 203 runs via the connections 10, 11; 110, 111 when the amplifier devices 2, 3; 102, 103; 202, 203 are a run in the common mode.

According to some aspects, the input circuit 108 comprises an input balun 112 and one input matching network 113A, 113B for each input signal.

According to some aspects, the input balun 112 is constituted by a broadside coupled line input 320 where a ground plane 317 is provided between the broadside coupled lines of the line input 320 to create two microstrip lines 321, 322.

According to some aspects, the input circuit 108 comprises transmission lines $TL1_{in}$, $TL2_{in}$ running from the input balun 112 towards input matching networks 113A, 113B, where the amplifier arrangement 100, 200 comprises a resistive component 122 that connects ground potentials of each transmission line $TL1_{in}$, $TL2_{in}$.

According to some aspects, the input circuit 8 comprises two digital-to-analogue converters 20A, 20B (DACs) that are connected to the respective terminals of the amplifier devices 2, 3.

According to some aspects, the DACs 20A, 20B, are adapted to receive signal input by means of corresponding optical couplers 21A, 21B.

According to some aspects, the input circuit 8 comprises two optical couplers 21A, 21B, that are connected to the respective terminals of the amplifier devices 2, 3.

According to some aspects, the output circuit 109, 109' comprises at least one output matching network 115, 215A, 215B.

According to some aspects, the connections 110, 111 are connected to at least partly constitute an output balun 116 that is connected to the output matching network 115.

According to some aspects, the second type output terminals S of the amplifier devices 402, 403; 402, 403 are connected to electrically separated ground planes.

According to some aspects, the separated ground planes are formed by means of a slot 430 in a ground plane 431, the slot having a first longitudinal side 432 and a second longitudinal side 433.

The first type output terminal D of the first amplifier device 402 and the second type output terminal S of the second amplifier device 403 are connected to the ground plane 431 along the first longitudinal side 432 of the slot 430. The second type output terminal S of the first amplifier device 402 and the first type output terminal D of the second amplifier device 403 are connected to the ground plane 431 on an opposite side of the slot 430, along the second longitudinal side 433 of the slot 430.

According to some aspects, the output circuit 109' comprises transmission lines $TL1_{out}$, $TL2_{out}$ running from the output matching network 215A, 215B to an output balun 216, where the amplifier arrangement 200 comprises a resistive component 119 that connects ground potentials of each transmission line $TL1_{out}$, $TL2_{out}$.

Figure 8:
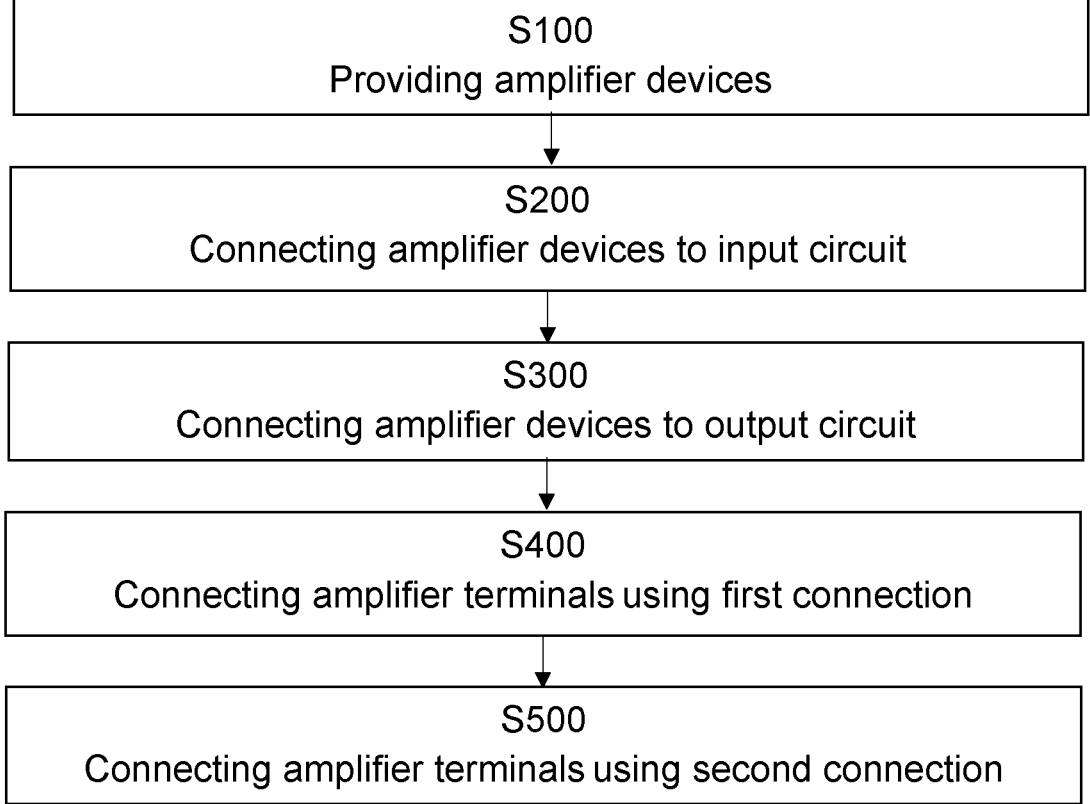
FIG. 8 shows a flowchart for methods according to the present disclosure.

With reference to FIG. 8, the present disclosure also relates to a method for configuring an amplifier arrangement 1, 100, 200, the method comprising providing S100 a first amplifier device 2, 102, 202 and a second amplifier device 3, 103, 203, each amplifier device 2, 3; 102, 103; 202, 203 having a first type output terminal 4, 6; D and a second type output terminal 5, 7; S. The method further comprises connecting S200 the amplifier devices 2, 3; 102, 103; 202, 203 to an input circuit 8, 108, and connecting S300 the output terminals 4, 6, D; 5, 7, S to an output circuit 9, 109, 109'. The method also comprises connecting S400 the first type output terminal 4, D of the first amplifier device 2, 102, 202 to the second type output terminal 7, S of the second amplifier device 3, 103, 203 using a first connection 10, 110, and connecting S500 the first type output terminal 6, D of the second amplifier device 3, 103, 203 to the second type output terminal 5, S of the first amplifier device 2, 102, 202 by using a second connection 11, 111.

The first type output terminal 4, D of the first amplifier device 2, 102, 202 and the first type output terminal 6, D of the second amplifier device 3, 103, 203 are electrically separated in the output circuit 9, 109, 109', and where the second type output terminal 5, S of the first amplifier device 2, 102, 202 second type output terminal 7, S of the second amplifier device 3, 103, 203 are electrically separated in the output circuit 9, 109, 109'.

According to some aspects, the method comprises providing a direct current, DC, blocking component 114A, 114B at each connection 110, 111.

According to some aspects, each connection 10, 11; 110, 111 constitutes a short-circuit at a pre-determined signal frequency band.

According to some aspects, the amplifier devices 2, 3, 102, 103; 202, 203 are used for running in a differential mode and in a common mode, where, for a certain frequency band, a majority of the current supplied by the amplifier devices 2, 3; 102, 103; 202, 203 runs via the connections 10, 11; 110, 111 when the amplifier devices 2, 3; 102, 103; 202, 203 are a run in the common mode.

According to some aspects, the method comprises providing an input balun 112 and one input matching network 113A, 113B for each input signal at the input circuit 108.

According to some aspects, the input balun 112 is constituted by a broadside coupled line input 320 where a ground plane 317 is provided between the broadside coupled lines of the line input 320 to create two microstrip lines 321, 322.

According to some aspects, the method comprises providing transmission lines $TL1_{in}$, $TL2_{in}$, running from the input balun 112 towards input matching networks 113A, 113B, at the input circuit 108, and providing a resistive component 122 that connects ground potentials of each transmission line $TL1_{in}$, $TL2_{in}$.

According to some aspects, the method comprises providing two digital-to-analogue converters 20A, 20B (DACs) at the input circuit 8, the DACs 20A, 20B being connected to the respective terminals of the amplifier devices 2, 3.

According to some aspects, the output circuit 109, 109' comprises at least one output matching network 115, 215A, 215B.

According to some aspects, the method comprises connecting the connections 110, 111 to at least partly constitute an output balun 116 that is connected to the output matching network 115.

According to some aspects, the method comprises connecting the second type output terminals S of the amplifier devices 402, 403; 402, 403 to electrically separated ground planes.

According to some aspects, the method comprises providing transmission lines $TL1_{out}$, $TL2_{out}$, running from the output matching network 215A, 215B towards an output balun 216, and providing a resistive component 119 that connects ground potentials of each transmission line $TL1_{out}$, $TL2_{out}$.

The present disclosure is not limited to the above, but may vary freely within the scope the appended claims. For example, according to some aspects, the slot can have many other shapes than the ones disclosed.

According to some aspects, the amplifier arrangement 1, 100, 200 is adapted to run the amplifier devices 2, 3; 102, 103; 202, 203 in a differential mode, where the amplifier devices 2, 3; 102, 103; 202, 203 will output both a differential mode and a common mode. According to the present disclosure, the common mode will be terminated in an impedance that can be a low reactive impedance. The differential mode can be terminated in a load $R_L$.

The invention claimed is:

1. An amplifier arrangement comprising:
a first amplifier device; and
a second amplifier device,
each amplifier device being connected to an input circuit, the input circuit comprising an input balun and one input matching network for each input signal, the input balun constituted by a broadside coupled line input and two microstrip lines, a ground plane being provided between the two microstrip lines,
each amplifier device has a first type output terminal and a second type output terminal where the output terminals are connected to an output circuit,
the first type output terminal of the first amplifier device is connected to the second type output terminal of the second amplifier device by means of a first connection,
the first type output terminal of the second amplifier device is connected to the second type output terminal of the first amplifier device by means of a second connection, the first type output terminal of the first amplifier device and the first type output terminal of the second amplifier device are electrically separated in the output circuit, and the second type output terminal of the first amplifier device and the second type output terminal of the second amplifier device are electrically separated in the output circuit.

2. The amplifier arrangement of claim 1, wherein each connection comprises a direct current (DC) blocking component.

3. The amplifier arrangement of claim 1, wherein each connection constitutes a short-circuit at a pre-determined signal frequency band.

4. The amplifier arrangement of claim 1, wherein the amplifier devices are adapted to be run in a differential mode and in a common mode, where, when run in the differential mode, a majority of the current supplied by the amplifier devices runs through a load and, where, for a certain frequency band, the majority of the current supplied by the amplifier devices does not run through the load when the amplifier devices are run in the common mode.

5. The amplifier arrangement of claim 1, wherein
the input circuit comprises an input balun and one input matching network for each input signal, and
the input circuit comprises transmission lines (TL1in, TL2in) running from the input balun towards input matching networks, where the amplifier arrangement comprises a resistive component that connects ground potentials of each transmission line (TL1in, TL2in).

6. The amplifier arrangement of claim 1, wherein
the input circuit comprises two digital-to-analogue converters that are connected to the respective terminals of the amplifier devices, and
the DACs are adapted to receive signal input by means of corresponding optical couplers.

7. The amplifier arrangement of claim 1, wherein the input circuit comprises two optical couplers that are connected to the respective terminals of the amplifier devices.

8. The amplifier arrangement of claim 1, wherein
the output circuit comprises at least one output matching network, and
the connections are connected to at least partly constitute an output balun that is connected to the output matching network.

9. The amplifier arrangement of claim 1, wherein
the second type output terminals of the amplifier devices are connected to electrically separated ground planes, and
the separated ground planes are formed by means of a slot in a ground plane, the slot having a first longitudinal side and a second longitudinal side, where the first type output terminal of the first amplifier device and the second type output terminal of the second amplifier device are connected to the ground plane along the first longitudinal side of the slot, and where the second type output terminal of the first amplifier device and the first type output terminal of the second amplifier device are connected to the ground plane on an opposite side of the slot, along the second longitudinal side of the slot.

10. The amplifier arrangement of claim 1, wherein
the output circuit comprises at least one output matching network, and
the output circuit comprises transmission lines (TL1out, TL2out) running from the output matching network to an output balun, where the amplifier arrangement comprises a resistive component that connects ground potentials of each transmission line (TL1out, TL2out).

11. A method for configuring an amplifier arrangement, the method comprising:
providing a first amplifier device and a second amplifier device, each amplifier device having a first type output terminal and a second type output terminal;
connecting the amplifier devices to an input circuit;
providing an input balun and one input matching network for each input signal at the input circuit, the input balun constituted by a broadside coupled line input and two microstrip lines, a ground plane being provided between the two microstrip lines;
connecting the output terminals to an output circuit;
connecting the first type output terminal of the first amplifier device to the second type output terminal of the second amplifier device using a first connection; and
connecting the first type output terminal of the second amplifier device to the second type output terminal of the first amplifier device by using a second connection, where
the first type output terminal of the first amplifier device and the first type output terminal of the second amplifier device are electrically separated in the output circuit, and
the second type output terminal of the first amplifier device and the second type output terminal of the second amplifier device are electrically separated in the output circuit.

12. The method of claim 11, wherein the method comprises providing a direct current, DC, blocking component at each connection.

13. The method of claim 11, wherein each connection constitutes a short-circuit at a pre-determined signal frequency band.

14. The method of claim 11, wherein the amplifier devices are used for running in a differential mode and in a common mode, where, when run in the differential mode, a majority of the current supplied by the amplifier devices runs through a load and, where, for a certain frequency band, the majority of the current supplied by the amplifier devices does not run through the load when the amplifier devices are run in the common mode.

15. The method of claim 11, wherein
the method comprises providing an input balun and one input matching network for each input signal at the input circuit, and
the method comprises providing transmission lines (TL1in, TL2in), running from the input balun towards input matching networks, at the input circuit, and providing a resistive component that connects ground potentials of each transmission line (TL1in, TL2in).

16. The method of claim 11, wherein the method comprises providing two digital-to-analogue converters, DACs, at the input circuit, the DACs being connected to the respective terminals of the amplifier devices.

17. The method of claim 11, wherein
the output circuit comprises at least one output matching network,
the method comprises connecting the connections to at least partly constitute an output balun that is connected to the output matching network, and
the method comprises providing transmission lines (TL1out, TL2out), running from the output matching network towards an output balun, and providing a resistive component that connects ground potentials of each transmission line (TL1out, TL2out).

18. The method of claim 11, wherein the method comprises connecting the second type output terminals of the amplifier devices to electrically separated ground planes, and the separated ground planes are formed by means of a slot in a ground plane, the slot having a first longitudinal side and a second longitudinal side, where the first type output terminal of the first amplifier device and the second type output terminal of the second amplifier device are connected to the ground plane along the first longitudinal side of the slot, and where the second type output terminal of the first amplifier device and the first type output terminal of the second amplifier device are connected to the ground plane on an opposite side of the slot, along the second longitudinal side of the slot.

\* \* \* \* \*